(12) United States Patent
Campiche et al.

(10) Patent No.: US 7,505,039 B2
(45) Date of Patent: Mar. 17, 2009

(54) TRACK OF STATISTICS

(75) Inventors: Thierry Campiche, Geneva (CH); Martin Miller, Avusy (CH)

(73) Assignee: Lecroy Corporation, Chestnut Ridge, NY (US)

(*) Notice: Subject to any disclaimer, the term of this patent is extended or adjusted under 35 U.S.C. 154(b) by 22 days.

(21) Appl. No.: 11/186,676

(22) Filed: Jul. 21, 2005

(65) Prior Publication Data
US 2007/0018985 A1  Jan. 25, 2007

(51) Int. Cl.
*G09G 5/22* (2006.01)
*G06T 11/20* (2006.01)

(52) U.S. Cl. .................................. 345/440.1; 345/440
(58) Field of Classification Search ....... 345/440–440.2
See application file for complete search history.

(56) References Cited

U.S. PATENT DOCUMENTS

| | | | | |
|---|---|---|---|---|
| 6,112,160 | A * | 8/2000 | Salant et al. ................... | 702/66 |
| 6,151,010 | A * | 11/2000 | Miller et al. .............. | 345/440.1 |
| 6,614,434 | B1 * | 9/2003 | Finke .......................... | 345/440 |
| 2003/0107573 | A1 * | 6/2003 | Miller ......................... | 345/440 |
| 2004/0212618 | A1 * | 10/2004 | Palmer ........................ | 345/440 |
| 2005/0240862 | A1 * | 10/2005 | Palmer ........................ | 345/440 |
| 2006/0006990 | A1 * | 1/2006 | Obradovich ................ | 340/439 |
| 2006/0055698 | A1 * | 3/2006 | Ritter ....................... | 345/440.1 |

OTHER PUBLICATIONS

"Communication waveform measurements", *Hewlett Packard*, Product Note 83475-1,(1995),2 through 24; especially p. 3.
"Demonstration guide HP5371A frequency and time interval analyzer", *Hewlett Packard*, (1990),1 through 11.
"Jitter and timing analysis (JitterPro, CCTM, JTA) for LeCroy Digital Oscilloscopes Operator's manual", *LeCroy Corporation*, (Oct. 2000),1-1 to 1-8; 4-1 to 406; 5-1 to 5-6; 7-1 to 7-10; B-1 to B-20.
"Tek CSA803 communications signal anaylzer", *Tektronix technical note 47W-7806*, (1990),1 through 4.
Derickson, Dennis , et al., "Fiber optic test and measurement", *Prentice Hall PTR*, Upper Saddle River, NJ 07458,(1998),284 through 338.
Yao, Kaishen , et el., "Noise adaptive speech recognition based on sequential noise parameter estimation", Speeh Communication 42 (2004) 5-23,(2004),5 through 23.

* cited by examiner

*Primary Examiner*—Chante Harrison
(74) *Attorney, Agent, or Firm*—Gordon Kessler

(57) ABSTRACT

A method and apparatus for generating a statistic based upon a persistence data is provided. The method comprises the steps of defining a plurality of slices of data comprising a persistence data and generating a histogram of the data within each of the plurality of slices. A parameter is measured for each of the generated histograms, and the measured parameters are plotted corresponding to each of the generated histograms.

10 Claims, 12 Drawing Sheets

TRACK OF STATISTICS

FIELD OF THE INVENTION

The present invention relates to a method and apparatus for performing a statistical analysis on accumulated persistence data generated from a signal captured by a digital oscilloscope, such as a real-time or sampling oscilloscope. The invention may also be applied to other forms of accumulated data.

BACKGROUND OF THE INVENTION

Traditionally, digital oscilloscopes capture, store and subsequently display representations of electronic signals. By storing the acquired signals in memory, a user is able to scroll forward or back through the representation of the signal as desired, and also to process the data to generate any number of various parametric statistics.

If the stored data is longer that the available memory, or for any other reason such as the user looking to capture events that occur randomly or infrequently, the user may choose to accumulate information about the stored data before it passes out of memory and the memory accepts newer data. Such an accumulation of data is called persistence data, and the display of this persistence data comprises a persistence map. This persistence map is typically representative of a large amount of acquired data. While a user is able to view various features of such a persistence map, information about the data forming the persistence map may not be available.

In an attempt to harvest additional information from persistence maps, LeCroy® Corporation Jitter & Timing Analysis Packages have provided functionality to a user allowing for the generation of a single slice from a persistence waveform. However, while useful, this view does not show enough additional information about the persistence map to be truly useful to a user.

Therefore, it would be beneficial to be able to provide additional information to a user about the data used from a persistence map.

SUMMARY OF THE INVENTION

In accordance with the invention, an oscilloscope, such as a LeCroy® real-time digital oscilloscope or LeCroy® sampling digital oscilloscope, accumulates multiple acquisitions and forms a persistence map. This persistence map is a two dimensional statistical view of the multiple data acquisitions accumulated by the oscilloscope. It may be displayed as a repetitive clock, a repetitive pattern or a well-known eye diagram. Further in accordance with the invention, this persistence map is analyzed, and a desired trace is written in a waveform (which may be displayed), correlated on one axis of the persistence map, and including statistical persistence slice measurements. Once this waveform is generated, any LeCroy® (or other) parametric measurement that is typically performed on a single trace may be performed on the persistence trace. Thus, in accordance with the invention, for example, one can measure the bit rate of Track of Standard Deviation measured on a Persistence Eye, and perform other measurements based upon multiple histograms generated from multiple slices of a persistence map.

It is therefore an object of the invention to provide an improved method and apparatus for analyzing persistence map data.

Still other objects and advantages of the invention will in part be obvious and will in part be apparent from the specification and the drawings.

The invention accordingly comprises the several steps and the relation of one or more of such steps with respect to each of the others thereof, which will be exemplified in the method (process) hereinafter disclosed, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

A persistence map comprises an accumulation of data obtained from multiple acquisitions acquired by a sampling or a digital oscilloscope. In accordance with the invention, various persistence slices are taken so as to create a sequence of histograms of the data of equidistant slices of the persistence map. The persistence map can be sliced horizontally or vertically. The number of slices and their width can be set manually or automatically. The resolution of track and the accuracy of statistics measured depend on this number of slices, slices width and the population accumulated in the persistence map.

From this sequence of histograms generated in accordance with the slicing of the persistence map, any kind of statistical measurements may be performed. These may include, for example, Standard Deviation, Mean, Mid, Maximum, etc. . . . Thus, any standard statistical parameters designed to be defined in accordance with histograms may be used. The result is a sequence of statistical measurements of equidistant slices of a persistence map.

Figure 1:
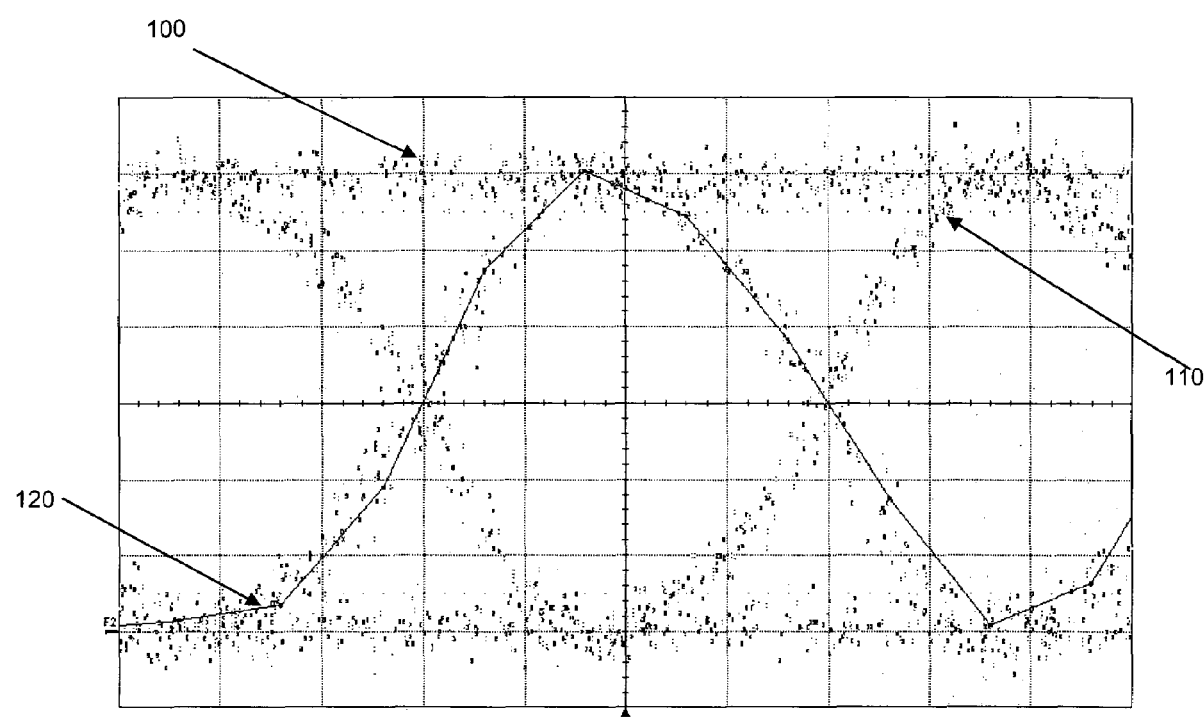
FIG. 1 is a screen shot depicting an accumulated persistence data map.

Referring next to FIG. 1, a persistence map 100 is shown, generated in accordance with a statistical algorithm for displaying information about a number of acquired traces. The data points 110 are drawn to the display, and are acquired from a number of consecutive data signal acquisition traces

120. Traditionally, such a persistence map is generated in a real time oscilloscope when there are more data traces than those that can be stored in memory, or when a user desires to view events that are infrequent. In the case of a sampling oscilloscope, the persistence map is the primary data acquisition result. The persistence may also be formed at any other desired time for any other desired purpose. The persistence map typically is viewed in the form of a well known eye diagram. However, the information may be stored and displayed as a periodic signal, an overlay of various correlated data, or data triggered at various time periods as desired by a user. The features of the invention are equally applicable to any of these forms of accumulated data.

Figure 2:
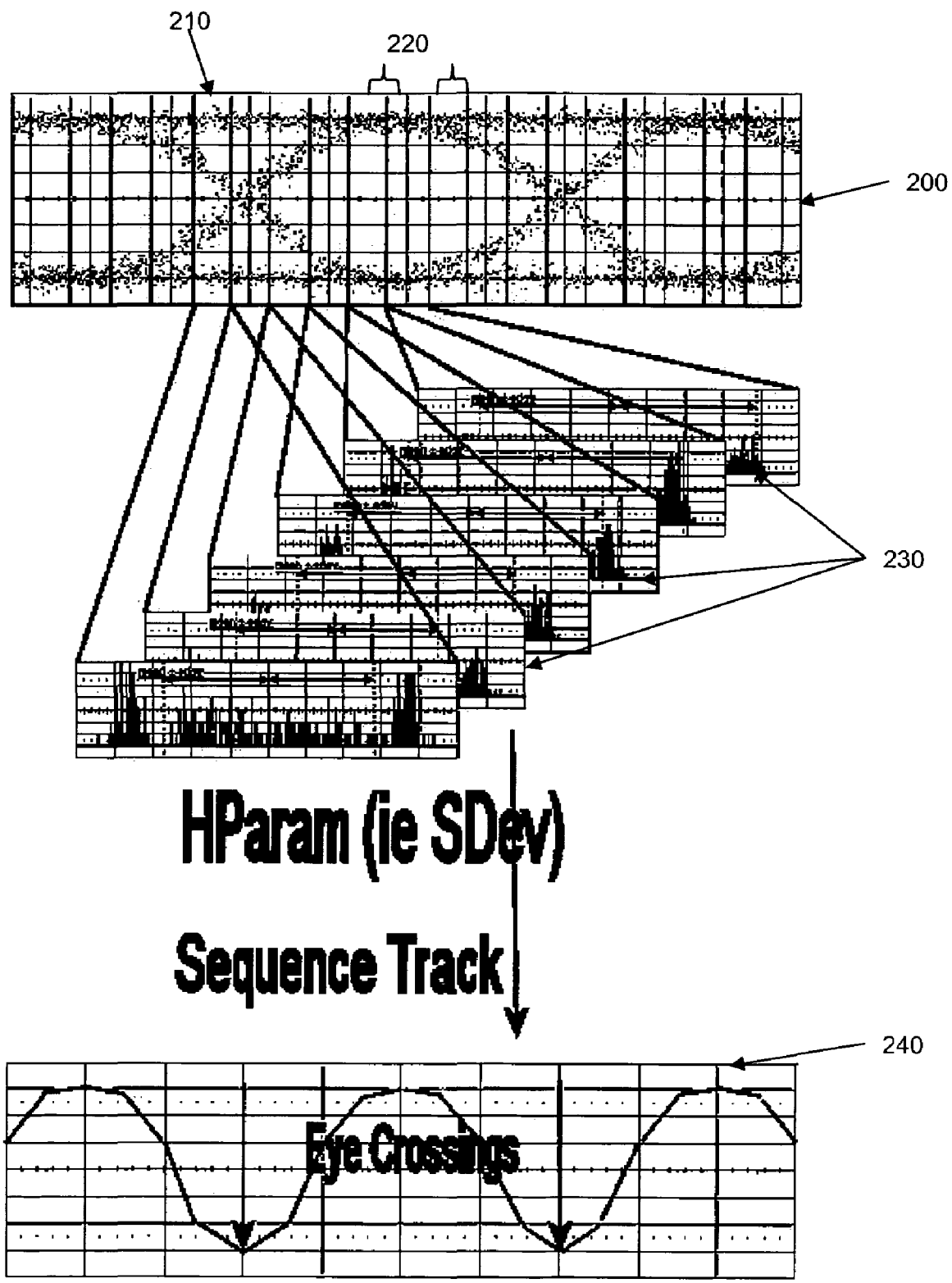
FIG. 2 is an illustration employing various screen shots depicting a sequence of measurements in accordance with the invention.

Referring next to FIG. 2, in accordance with the invention the persistence map may be sliced at desired intervals, and a waveform that represents the statistical measurement measured at each slice of the persistence map is computed. Therefore, as is shown in FIG. 2, a persistence map 210 is shown on a display 200.

As is further shown in FIG. 2, the persistence map is divided into a preselected number of time intervals, or slices 220. For each time interval, a histogram 230 is formed by counting the number of hits in each vertical location along the vertical axis. As is shown, each slice 220 extends from a designating line on the left to a designating line on the right. By then counting the hits within each interval, histograms 230 are formed. Of course, horizontal slicing may also be performed if desired.

Figure 3:
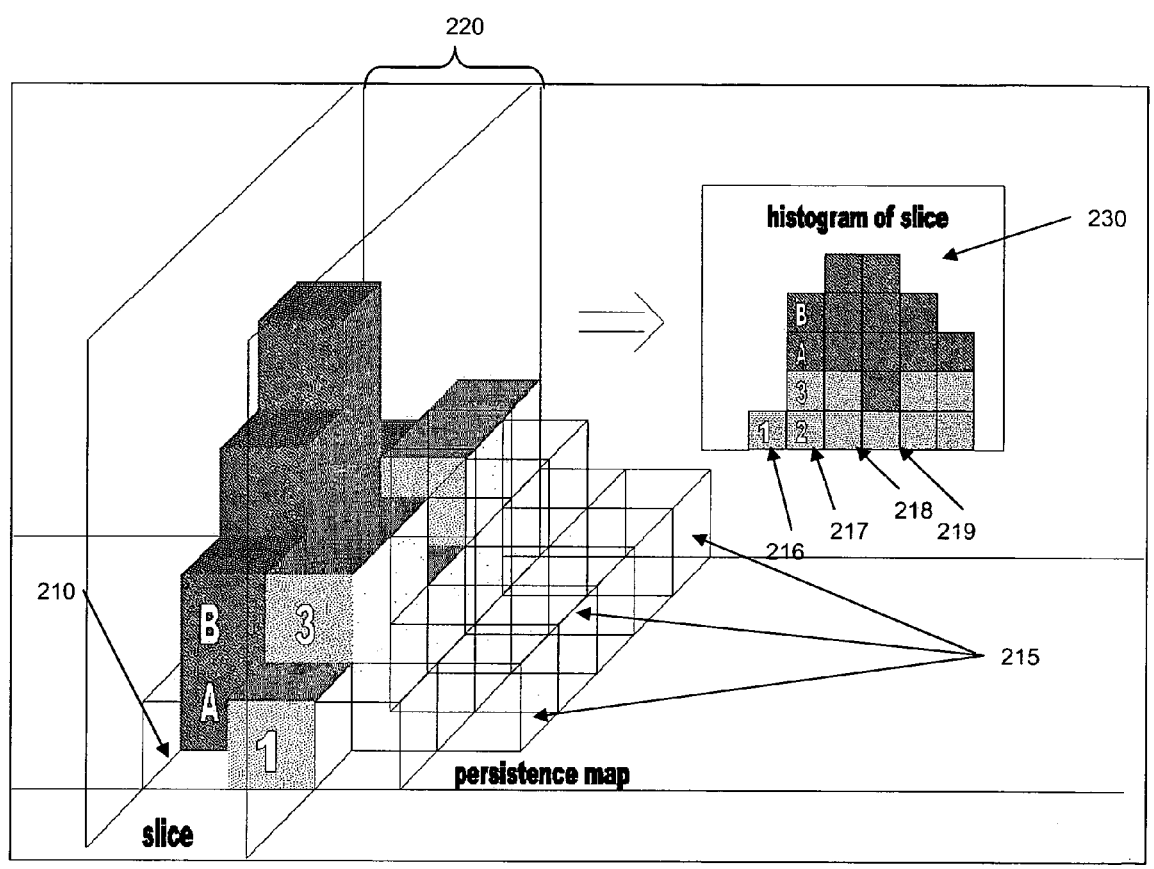
FIG. 3 is a depiction of the generation of a histogram for a slice of a persistence map in accordance with the invention.

As is further shown in FIG. 3, the x axis presents the number of desired histograms. Thus, each persistence slice 220 will be used to generate a histogram 230. In a preferred embodiment, 20 slices are made, generating 20 histograms. Of course, any desired number of slices may be taken. For each slice, a number of histogram bins 215 are defined in the y axis direction. As is further shown in the inset portion of FIG. 3, each bin 215 is then totaled up to determine the number of hits in the bin. Therefore, as is shown in FIG. 3, for example only as the bins and histograms in an actual embodiment would include many more data hits, each histogram 210 is two pixels wide, and each histogram bin is one pixel wide. The first bin 216 on the left shows 1 pixel, the second bin 217 shows 4 pixels, and the third and fourth bins 218, 219 show 5 pixels each. These values correspond to the number of pixels determined by adding up the pixels in each bin of the persistence map. In this manner, a histogram 230 is built up for each slice of the persistence map. While the slices are all shown being taken along the x axis, and the histogram boxes along the y axis From the sequence of the various histograms 230, a user is then able to measure various parameters on each of the histograms, such as Histogram Standard Deviation, Histogram Mean, Histogram Top, Histogram Base, Histogram X At Peak, Histogram Amplitude, Histogram Full-Width at Half Population, Histogram Full-Width a X Population, Histogram Maximum, Histogram Maximum Population, Histogram Median, Histogram Minimum, Histogram Mode, Histogram Percentile, Histogram Number Of Peaks, Histogram Range, Histogram RootMean Square, Histogram Total Population, etc. However, the available measurements may be extended as desired. Referring once again back to FIG. 2 a measurement of standard deviation for each of the histograms is provided. Finally, in accordance with the invention, A single trace 240, representative of the measured parameter over time may be generated and displayed. This trace 240 may then be analyzed to derive various data. For example from the displayed trace, the user is able to determine the location of eye diagram crossings in accordance with portions of the statistical trace that have the least standard deviation. Similar data analysis may be performed with other parameters.

Figure 4:
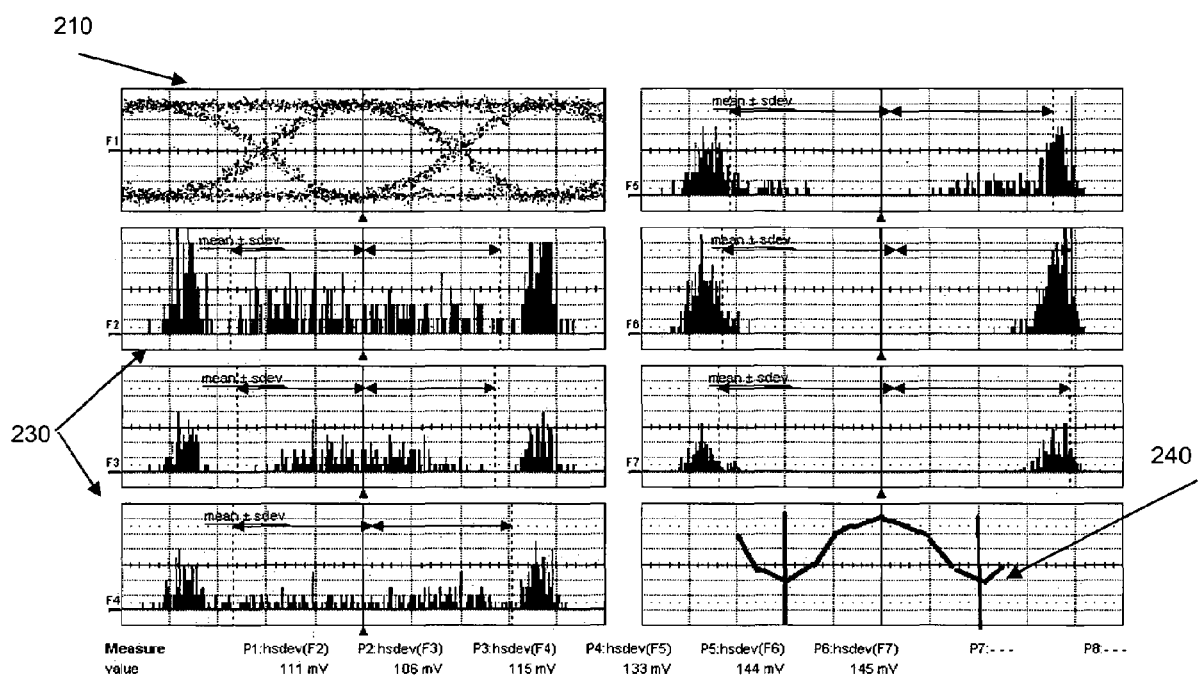
FIG. 4 is a screen shot depicting an example of a persistence map, a number of histogram slices, and a generated parameter trace, constructed in accordance with the invention.

FIG. 4 represents a screen shot of the processing described above with respect to FIG. 2. As is shown in FIG. 4, the persistence map 210, all associated slice histograms 230 and the final parameter trace 240 are easily viewed by a user. In this practical example, it can be seen that the first zero crossing for the standard deviation of the persistence map is at −200 picoseconds and second at +200 picoseconds. This gives us the average bit duration and position from an eye. This is important for any measurement on the eye diagram that must be made on a certain portion of the eye diagram, such as, by way of example, to define an eye aperture which is 20% of a bit at the center of the eye.

Figure 5:
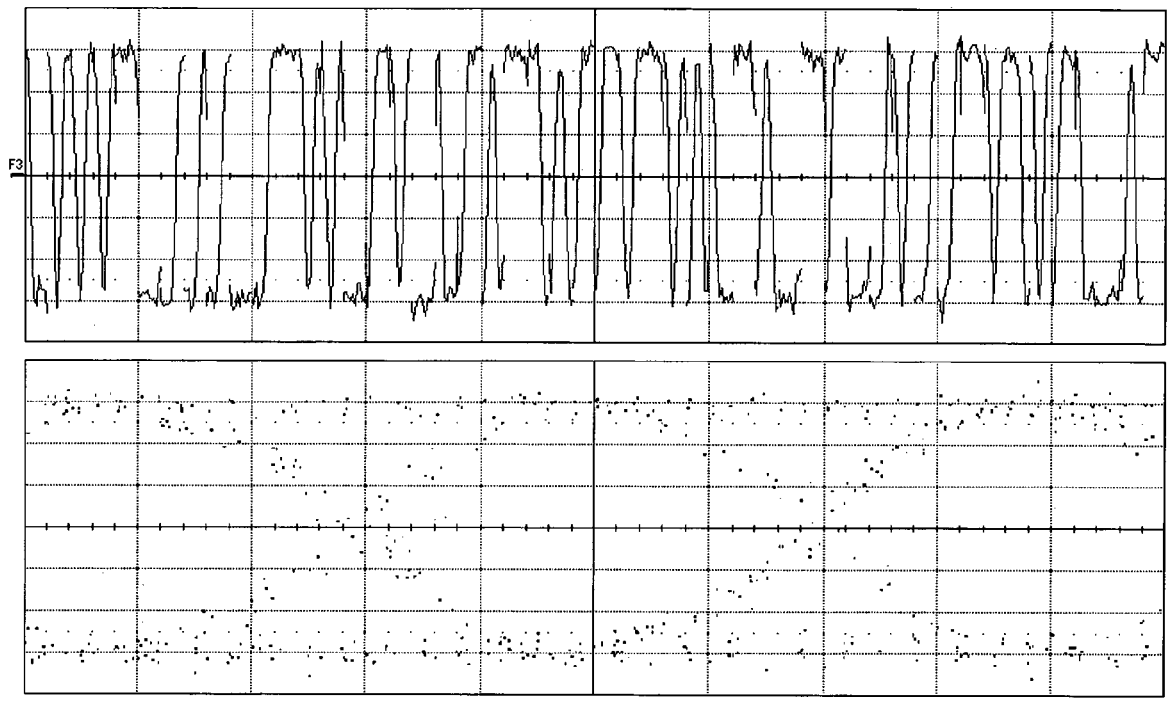
FIG. 5 is a screen shot depicting a persistence map build from a sequence of acquisitions.

In addition to generating a persistence map based upon an overlay of accumulated waveforms, it is also possible to generate a persistence map from a sequence of waveforms. Such a persistence map is shown in FIG. 5.

Figure 6:
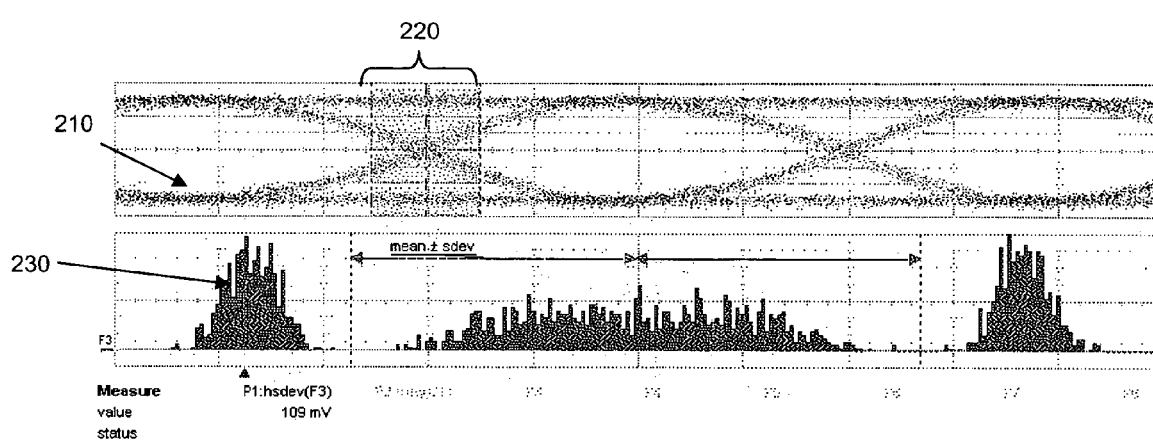
FIG. 6 is a screen shot depicting the generation of a histogram for a particular slice of the persistence map data.
Figure 7:
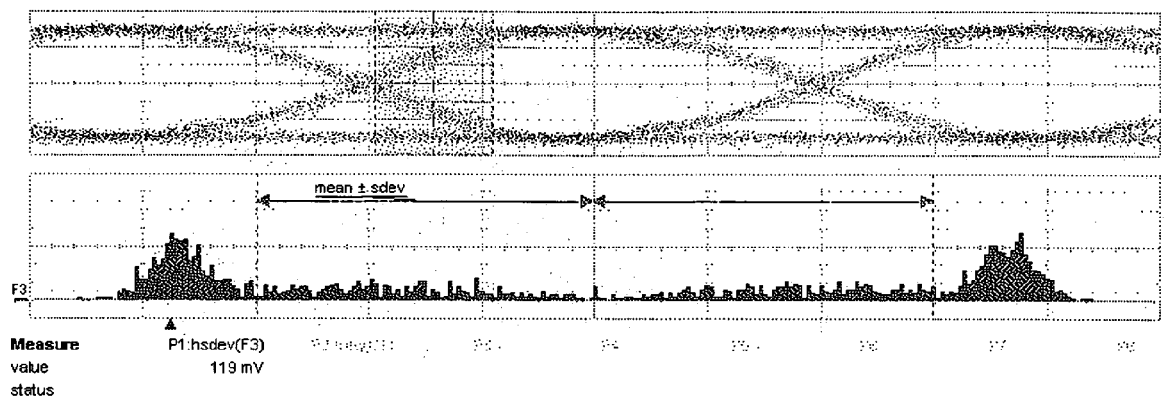
FIG. 7 is a screen shot depicting the generation of a histogram for another slice of the persistence map data.
Figure 8:
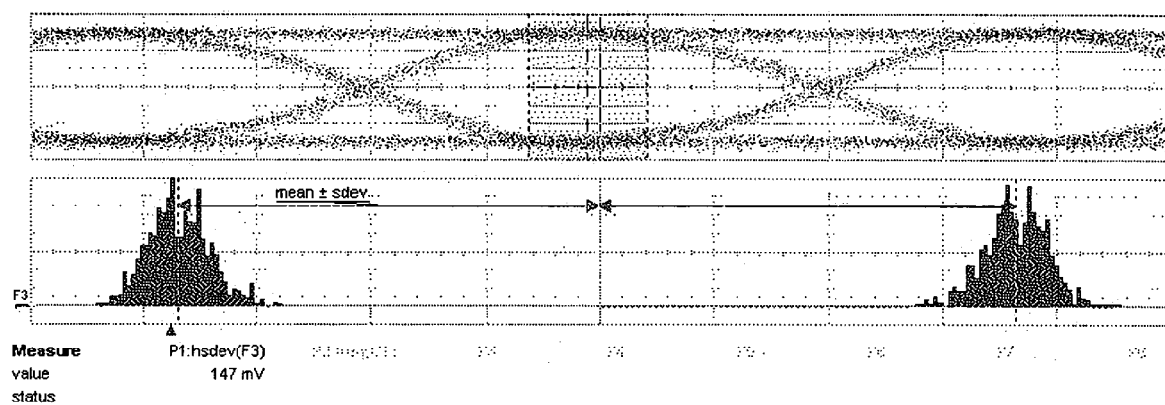
FIG. 8 is a screen shot depicting the generation of a histogram for yet another slice of the persistence map data.

Referring next to FIG. 6, the process generating a slice of a persistence map will be described. Once again, persistence map 210 is displayed, and the slicing time interval 220 is defined to include a portion of the eye diagram persistence map where the crossover point is located. A histogram 230 for the defined slice is generated. Similarly in FIGS. 7 and 8, similar histograms are formed for slices just off of the crossing point (FIG. 7) and where only the high and low levels populate the histogram (FIG. 8). Each selected slicing location generates a different looking histogram, based upon the makeup of the persistence map at that location.

Figure 9:
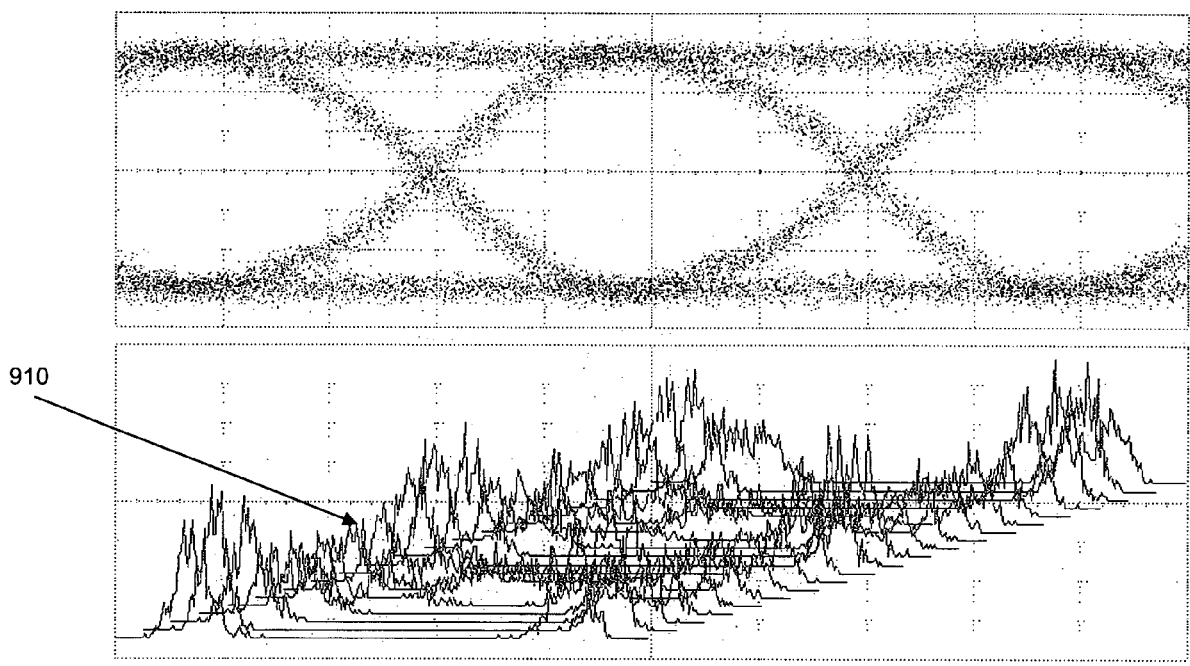
FIG. 9 is a screen shot depicting a waterfall display of generated histograms.

Referring next to FIG. 9, once the histograms have been generated for each of the slices, they may be displayed together, preferably in a cascade arrangement, to provide a type of topographical map of the persistence map. Such a configuration is shown at 910. As can be seen, viewing the waterfall sequence of histogram slices, a type of three dimensional representation of the persistence map is displayed. In this preferred embodiment, 20 slices are made, generating 20 histograms. Of course, and desired number of slices may be taken. This view of the histograms itself can provide useful information regarding the statistic in question.

Figure 10:
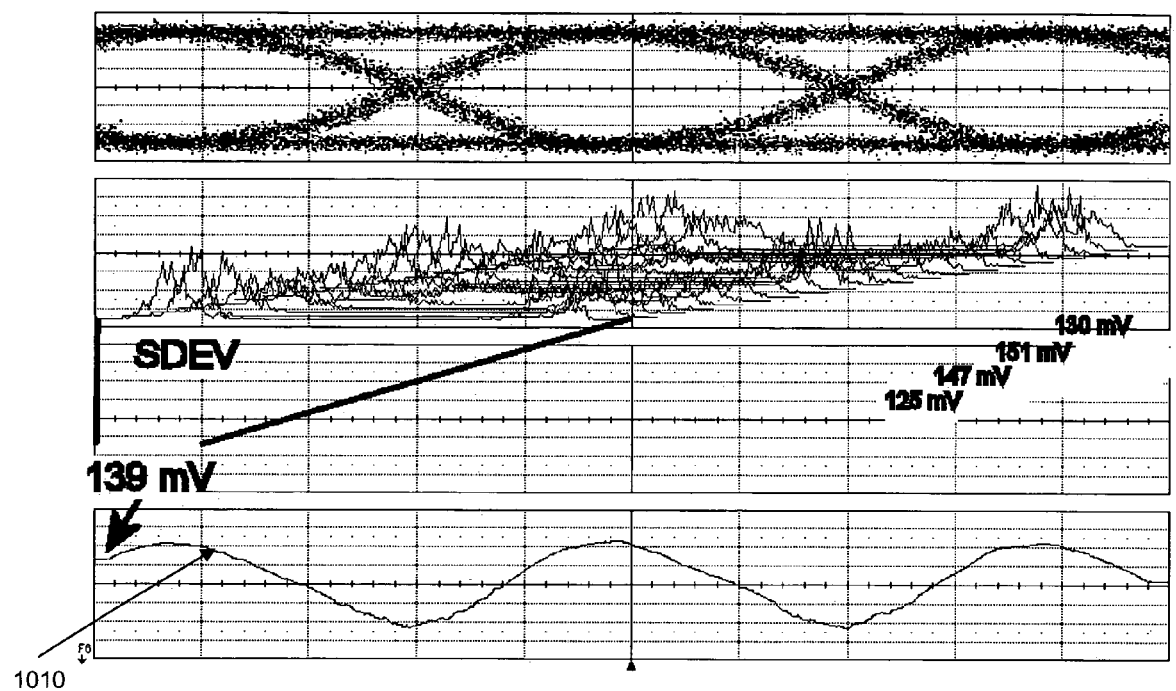
FIG. 10 is a screen shot depicting a persistence map, and associated parameter map in accordance with the invention.

Once the slices are displayed on the display, processing continues to generate a trace representative of a parameter to be measured on the various histograms. Thus, a parameter is measured for each of the histogram slices, generating a single value of the parameter for each histogram. After performing the same parameter measurements for each histogram, generating a sequence of values, this sequence of values is plotted against a time axis, the timing position for each parameter value corresponding to the relative timing of the associated data slice After processing of the various data, a trace may be generated representative of the desired parameter across all of the sliced histograms. As is shown in FIG. 10, the standard deviation of the value of all of the histograms at the indicated time is plotted. This generates a trace that can be shown on the display, as shown at 1010. Such a trace, and traces that may be generated for other parameters that may be measured in this matter allow the user to perform some of the more traditional parameter analysis on a persistence map that has typically not been subject to such statistical analysis.

In accordance with the invention, the method and apparatus for preferably implementing the statistical analysis on persistence map data is implemented in software running of an oscilloscope. However, this software may run on any processing apparatus that has persistence type data input to it. For example, a multi-purpose personal computer may be coupled to an oscilloscope, or other data acquisition or generation device. Software running of the computer may utilize input data, processing it in a manner similar to the processing described on the oscilloscope noted above.

Figure 11:
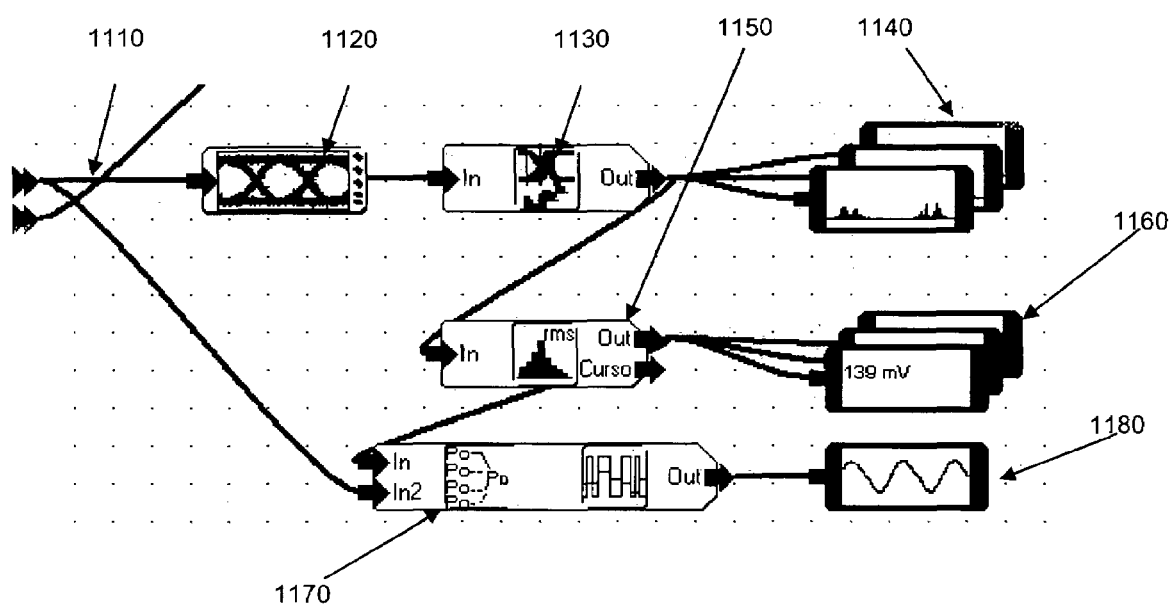
FIG. 11 is a flow chart diagram depicting a processing web used to implement the processing in accordance with the invention.

In a preferred embodiment of the invention, the software for implementation is incorporated into a graphical processing web that allows a user to use predefined elements, or construct custom elements, that can be connected in a processing web to control the physical functioning of the oscilloscope apparatus. Therefore, as is shown in FIG. 11, data of an acquired data signal 1110 is accumulated to generate a persistence map 1120. After accumulation, the persistence map data is forwarded to a persistence data slicer 1130. The data slicer 1130 generates a preselected number of histograms 1140 from slicing of the persistence data.

These histograms of sliced data are then forwarded to a histogram parameter measurer 1150. This parameter measurer performs a desired parameter measurement on each histogram, thus generating a single parameter value for each histogram. In the case of a standard deviation measurement, such as that discussed above, the standard deviation of the first histogram is 139 mv. Similar processing is performed on all of the generated histograms to generate a sequence of values 1160, one corresponding to each histogram.

This sequence of values 1160 is then forwarded, along with the original acquired data, to a trace generating element 1170 for generating a single trace comprising all of the values 1160. Such a trace is shown, for example, at 1010 of FIG. 10, and is output from the processing web at 1180.

Figure 12:
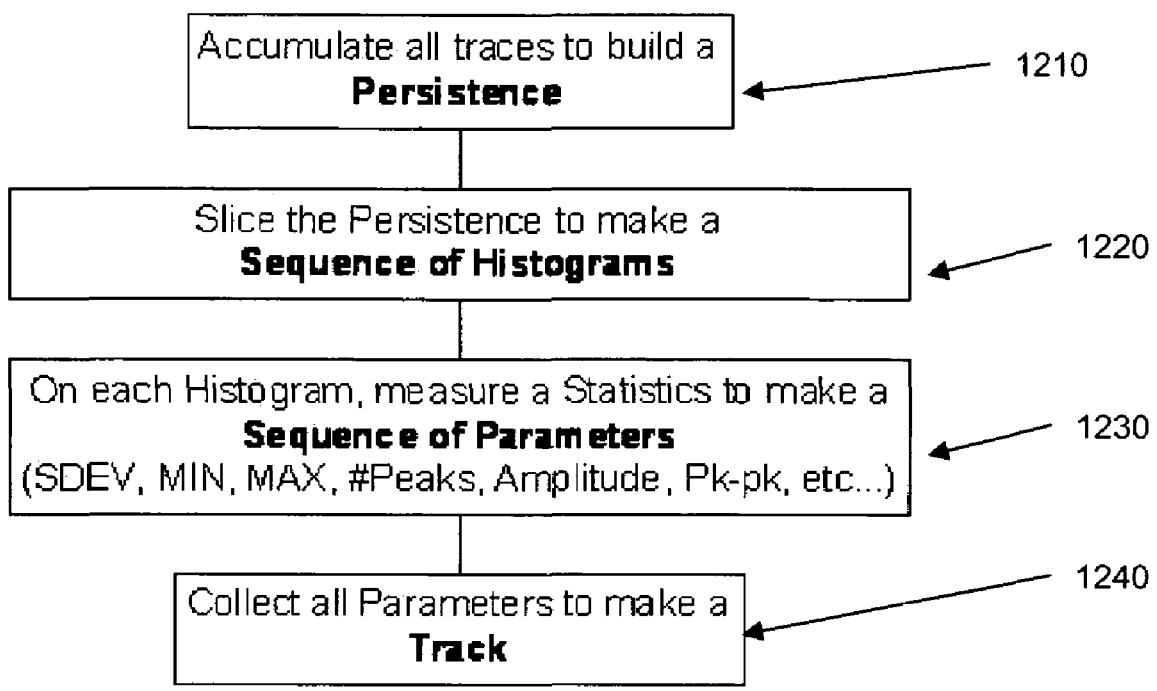
FIG. 12 is a flow chart diagram depicting the processing steps in accordance with the invention.

The steps required to be performed by the processing apparatus are shown in FIG. 12. First, a persistence map is built by the accumulation of data from all desired traces at step 1210. The persistence data is then sliced and measured to form a number of histograms at step 1220. At step 1230, each histogram is processed according to a particular desired parameter to generate a single value for the parameter associated with the histogram. These parameters may include, for example, standard deviation, minimum measurements, maximum measurements, number of peaks, amplitude, peak-to-peak, or any other desired parameter measurement. After generation of the parameter values for each of the histograms, these values are plotted on a single graph, generating a single trace representative of the value of the parameter in the persistence map over time at step 1240.

Therefore, in accordance with the invention, a user is able to generate and see parameter measurements on persistence maps that are traditionally no provided based upon a persistence map. The user can then view such traces as they would when generated based upon a real-time data acquisition, providing a useful system of analysis for a user.

While the invention has been described as being applicable to stored persistence data, the invention may also be applied to other forms of accumulated data, including but not limited to monochrome pixel maps, bistable storage CRTs, normal phosphor CRTs, DPOs, infinite digital storage HOLD processes, PEAK detect sequences, and further including general image analysis, such as density, brightness, RF field strength, topography, eye stress, and BERT contours It will thus be seen that the objects set forth above, among those made apparent from the preceding description, are efficiently obtained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for generating a statistic based upon persistence data, comprising the steps of:
    obtaining data from a data acquisition device;
    defining a plurality of slices of data comprising a persistence data;
    generating a histogram of the data within each of the plurality of slices;
    calculating a parametric measurement for each of the generated histograms; and
    plotting the calculated parametric measurement corresponding to each of the generated histograms.

2. The method of claim 1, wherein the calculated parametric measurements are plotted against a time axis in an order corresponding to the relative positioning of the corresponding data slices.

3. The method of claim 1, wherein at least two of the plurality of slices are contiguous in time.

4. The method of claim 1, wherein the parameter is one of the following: (i) standard deviation, (ii) minimum measurements, (iii) maximum measurements, (iv) number of peaks, (v) amplitude, (vi) peak-to-peak, (vii) mean, (viii) top, (ix) base, (x) x at peak, (xi) full width at population, (xii) maximum population, (xiii) median, (xiv) mode, (xv) percentile, (xvi) range, (xvii) root mean square, or (xviii) total population.

5. An oscilloscope for generating a statistic based upon persistence data, comprising:
    means for defining a plurality of slices of data comprising a persistence data;
    means for generating a histogram of the data within each of the plurality of slices;
    means for calculating a parametric measurement for each of the generated histograms; and
    a display for plotting the calculated parametric measurements corresponding to each of the generated histograms.

6. The oscilloscope of claim 5, wherein the display plots the calculated parametric measurements against a time axis in an order corresponding to the relative positioning of the corresponding data slices.

7. The oscilloscope of claim 5, wherein at least two of the plurality of slices are contiguous in time.

8. The oscilloscope of claim 5, wherein the parameter is one of the following: (i) standard deviation, (ii) minimum measurements, (iii) maximum measurements, (iv) number of peaks, (v) amplitude, (vi) peak-to-peak, (vii) mean, (viii) top, (ix) base, (x) x at peak, (xi) full width at population, (xii) maximum population, (xiii) median, (xiv) mode, (xv) percentile, (xvi) range, (xvii) root mean square, or (xviii) total population.

9. The oscilloscope of claim 5, wherein a time interval of each of the plurality of slices interval corresponds to a time interval relative to a start of each data trace.

10. The oscilloscope of claim 5, wherein a time interval of each of the plurality of slices interval corresponds to a time interval on a display.

* * * * *